(12) United States Patent
Abe

(10) Patent No.: US 7,687,290 B2
(45) Date of Patent: Mar. 30, 2010

(54) METHOD FOR MANUFACTURING SEMICONDUCTOR OPTICAL DEVICE

(75) Inventor: Shinji Abe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 179 days.

(21) Appl. No.: 12/049,456

(22) Filed: Mar. 17, 2008

(65) Prior Publication Data

US 2008/0233668 A1   Sep. 25, 2008

(30) Foreign Application Priority Data

Mar. 23, 2007 (JP) ............... 2007-076871

(51) Int. Cl.
*H01L 21/00* (2006.01)
(52) U.S. Cl. .............. 438/31; 438/16; 438/32; 438/39; 257/98; 257/E33.06
(58) Field of Classification Search ............ 438/16, 438/22–27, 31–32, 39
See application file for complete search history.

(56) References Cited

U.S. PATENT DOCUMENTS 6,067,310 A    5/2000   Hashimoto et al.
6,580,738 B2 * 6/2003   Fukunaga ............... 372/46.01
2008/0042244 A1 * 2/2008 Anzue et al. ............ 257/613

FOREIGN PATENT DOCUMENTS

| GB | 2 358 281 A | 7/2001 |
|----|-------------|--------|
| JP | 6-13703     | 1/1994 |
| JP | 6-104522    | 4/1994 |
| JP | 9-92927     | 4/1997 |
| JP | 2000-82867 A | 3/2000 |
| JP | 2001-308461 A | 11/2001 |

OTHER PUBLICATIONS

Ooi, Boon Siew et al., "Selective Quantum-Well Intermixing in GaAs-AlGaAs Structures Using Impurity-Free Vacancy Diffusion", IEEE Journal of Quantum Electronics, 33(10):1784-1793 (1997).

* cited by examiner

*Primary Examiner*—Dung A. Le
(74) *Attorney, Agent, or Firm*—Leydig, Voit & Mayer, Ltd.

(57) ABSTRACT

A method for manufacturing a semiconductor optical device includes: forming a laminated semiconductor structure of GaN-based materials on a semiconductor wafer, the laminated semiconductor structure forming a laser diode of GaN-based materials, including an active layer having a quantum well structure; cleaving the semiconductor wafer including the laminated semiconductor structure to expose a cleaved end face of the laminated semiconductor structure; and forming an $SiO_2$ film on the cleaved end face and performing a heat treatment to cause Ga vacancy diffusion in the active layer to disorder the quantum well structure of the active layer.

4 Claims, 7 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a GaN-based semiconductor optical device, and more particularly to a method for manufacturing a GaN-based semiconductor optical device in which the waveguide has a window region formed in an end face thereof.

2. Description of the Related Art

Recently, in order to enhance the recording density of optical discs, intense R&D effort has been carried out to develop semiconductor lasers capable of light emission in the blue to ultraviolet range. Such semiconductor lasers include GaN-based semiconductor lasers formed of a Group III-V nitride compound semiconductor such as AlGaInN, which are already in practical use.

These blue-violet laser diodes (hereinafter referred to as "blue-violet LDs") are formed by growing a compound semiconductor in crystal form on a GaN substrate.

A representative compound semiconductor is the Group III-V compound semiconductor, in which Group III and V elements are combined together. Mixed crystal III-V compound semiconductors having different compositions can be formed by bonding pluralities of Group III atoms and Group V atoms in different manners. Examples of GaN-based compound semiconductors used to form a blue-violet LD include GaN, GaPN, GaNAs, InGaN, and AlGaN.

As is known, GaN-based LDs are used as optical sources in next generation DVD drives (a type of optical disc drive). In order to increase the writing speed of these drives, it is important to increase the output power of the GaN-based LD used therein. One problem limiting the output power of LDs is catastrophic optical damage (COD), since it greatly affects the reliability of the LDs.

An effective method for preventing COD to an LD is to reduce the light absorption and temperature of its end face portions.

The end faces of an LD, unlike the inside of the LD, include a large number of dangling bonds (or broken covalent bonds), since these faces are formed by cleaving. Therefore, surface level, that is, surface energy states which trap carriers are present at the end faces of the LD and cause many nonradiative recombinations, i.e., recombinations of electrons and holes which do not contribute to light emission. Since carriers injected into the end face portions of an LD are lost due to nonradiative recombination, these portions have a lower effective density of injected carriers than the center portion of the length of the LD in the waveguide direction. As a result, the end face portions act as light absorbing regions and increase in temperature during the operation of the LD, since the absorbed light is transformed into heat energy. This results in a reduction in the bandgap, which causes these portions to further absorb light. This positive feedback (or vicious cycle between the temperature rise and the light absorption increase of the end face portions) may lead to a situation where the temperature of the end face portions exceed the melting point of their material resulting in melting of these portions and hence occurrence of COD. One method for preventing this is to form a window structure in each end face portion to increase its bandgap and thereby reduce or limit its light absorption.

Another method for preventing COD to an LD is to enhance the heat dissipation capability of the LD and thereby reduce its temperature.

Conventional LDs formed of GaAs-based, AlGaAs-based, InP-based, or AlGaInP-based material have a window structure formed in one or each end face thereof. Such a window structure is formed by disordering an end face portion of the active layer and thereby increasing its bandgap. That is, the formation of the window structure reduces or limits the light absorption of the end face portion.

A known conventional semiconductor laser device having a window structure is constructed as follows.

An n-$Al_{0.6}Ga_{0.4}As$ lower cladding layer, an active layer region, and a p-$Al_{0.6}Ga_{0.4}As$ upper cladding layer are sequentially formed on top of one another on an n-GaAs substrate. (The active layer region includes an undoped GaAs active layer.) Electrodes are then formed, and the wafer is cleaved to produce a Fabry-Perot resonator. An $SiO_2$ film having a thickness of 2500 Å is then formed on the light emitting end face of the resonator and heat treated at 950° C. in a hydrogen atmosphere for 30 seconds by RTA (rapid thermal annealing) to disorder the active layer. This increases the energy gap of the active layer, thereby forming a window region therein. (See, e.g., JP-A-6-13703, paragraphs 0009 to 0014, FIG. 1.)

A known method for manufacturing a semiconductor laser device proceeds as follows. First, a laminated semiconductor structure, or multilayer structure, is formed on an n-type GaAs substrate. The laminated structure includes an n-type AlGaAs cladding layer, an active region including a GaAs quantum well layer, and a p-type AlGaAs cladding layer. Next, a mesa, or stripe, is formed by etching and then buried under an n-type GaAs layer to form a waveguide. The wafer is then cleaved in a direction perpendicular to the length of the stripe to produce a resonator having a length of approximately 500 µm. A silicon dioxide film is then formed on each end face of the semiconductor laser device structure (or resonator) and heated at 850° C. for 30 minutes to diffuse Si into the end face portions of the quantum well active region. This disorders and thereby transforms these end face portions into window structures having a wider effective bandgap than the undisordered center portion of the active region. (See, e.g., JP-A-6-104522, paragraph 0015, FIGS. 1 and 2.)

Another known method for manufacturing a semiconductor laser device proceeds as follows. First, a plurality of semiconductor laser devices are formed on an n-GaAs wafer. Next, the wafer is cleaved along crystal planes into laser bars each including a plurality of semiconductor laser devices arranged in a line. It should be noted that this cleaving forms the end faces of the resonators of these devices. A reflective film made up of an $SiO_2$ film and an SiN film is then formed on the front end faces of the resonators. The reflective film of each laser bar is then lamp-annealed or laser-annealed in an RTA system to cause the excessive Si in the $SiO_2$ film to diffuse into the front end face portions of the semiconductor laser devices. This causes the front end face portion of the MQW active layer to be intermixed with the Si, resulting in an increase in the bandgap of the MQW active layer and hence a decrease in its light absorption. (See, e.g., JP-A-9-92927, paragraphs 0024 to 0027, FIGS. 1 to 5.)

Further, there is a known technique of achieving selective quantum well intermixing in GaAs—AlGaAs structures by impurity-free vacancy diffusion. (See, e.g., Boon Siew Ooi et al., "Selective Quantum-Well Intermixing in GaAs—AlGaAs Structures Using Impurity-Free Vacancy Diffusion," IEEE JOURNAL OF QUANTUM ELECTRONICS, VOL. 33, NO. 10, 1997, pp. 1784-1793.)

GaAs, InP, and AlGaInP have relatively low heat conductivities of 0.55 W/cm*K, 0.68 W/cm*K, and 0.067 W/cm*K, respectively. On the other hand, GaN-based material, which is used to form a blue-violet LD, has a high heat conductivity, as compared to GaAs-based, InP-based, and AlGaInP-based materials. For example, GaN has a heat conductivity of 2 W/cm*K. Therefore, blue-violet LDs are less likely to suffer from COD than LDs formed of GaAs-based, InP-based, or AlGaInP-based material, and conventional blue-violet LDs do not have a window structure formed therein.

However, since the end faces of the resonator of a blue-violet LD are also formed by cleaving, surface level exists at these end faces, as in the case of a red LD. It should be noted that there is a need to increase the output power of blue-violet LDs including those used as writing LDs in DVD drives. Increasing the output power of blue-violet LDs will result in a situation where the problem of COD can no longer be ignored. This means that blue-violet LDs also need to have a window structure to achieve high output power.

However, although Zn, Si, etc. can be used as impurities to form a window structure in LDs of GaAs-based material (having an oscillation wavelength of 780 nm) and in LDs of AlGaInP-based material (having an oscillation wavelength of 660 nm), they cannot be used to form an effective window structure in LDs of GaN-based material (having an oscillation wavelength of 405 nm) since the light absorption of the end faces will increase.

SUMMARY OF THE INVENTION

The present invention has been devised to solve the above problems. It is, therefore, a primary object of the present invention to provide a method for manufacturing an LD of GaN-based material in such a way that a window structure is formed in an end face of the LD by a simple process to reduce its light absorption.

According to one aspect of the present invention, there is provided a method for manufacturing a semiconductor optical device comprising: forming a laminated semiconductor structure of GaN-based material on a semiconductor wafer, the laminated semiconductor structure having a first semiconductor layer of a first conductivity type, an active layer including a quantum well structure, and a second semiconductor layer of a second conductivity type, in sequence, on a semiconductor substrate; cleaving the semiconductor wafer to expose a cleaved end face of the laminated semiconductor structure; forming a dielectric film on the cleaved end face; and disordering the quantum well structure of the active layer by performing a heat treatment to cause Ga vacancy diffusion in the active layer.

The method for manufacturing a semiconductor optical device according to the present invention includes the heat treatment causes Ga to be diffused from the laminated semiconductor structure into the dielectric film, generating and diffusing Ga vacancies in the laminated semiconductor structure. Ga vacancies in the laminated semiconductor structure disorders the quantum well structure of the active layer and thereby forms a window structure therein.

Accordingly, The present invention is advantageous that the formed window structure has low light absorption since no impurities are used in this window forming process. As a result, it is possible to manufacture a semiconductor optical device of GaN-based material in such a way that a window structure is formed in an end face of the device by a simple process to prevent COD thereto.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

While a preferred embodiment of the present invention will be described in connection with a ridge waveguide blue-violet LD serving as a type of semiconductor optical device, it is to be understood that the invention is not limited to such a blue-violet LD. The present invention can be applied to any type of blue-violet LD, with the same effect.

First Embodiment

Figure 1:
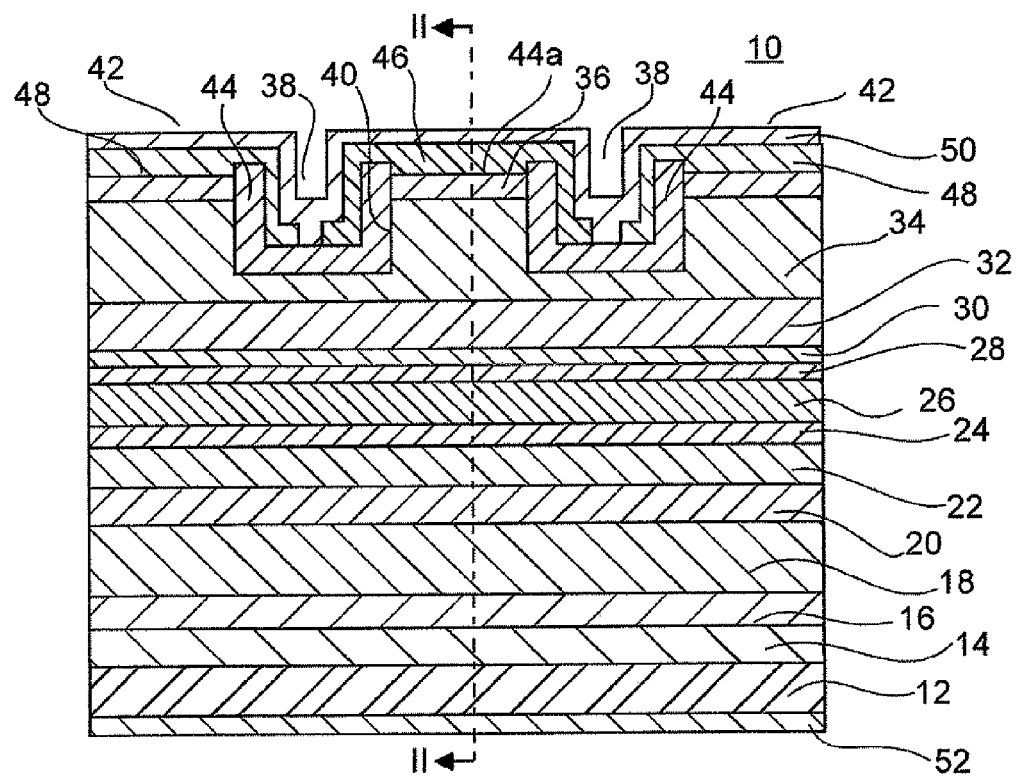
FIG. 1 is a cross-sectional view of an LD according to an embodiment of the present invention taken in a direction perpendicular to the longitudinal direction of the waveguide.

FIG. 1 is a cross-sectional view of an LD according to an embodiment of the present invention taken in a direction perpendicular to the longitudinal direction of the waveguide. It should be noted that in the figures, like numerals are used to denote like or corresponding components.

Referring to FIG. 1, the LD 10 is a ridge waveguide blue-violet LD in which the following layers are sequentially formed on top of one another on one principal surface (a Ga surface) of an n-type GaN substrate 12 (n-type, p-type, and i-type (undoped) being hereinafter abbreviated as "n-," "p-," and "i-," respectively): a buffer layer 14 of n-GaN; a first n-cladding layer 16 of n-AlGaN formed on the buffer layer 14; a second n-cladding layer 18 of n-AlGaN formed on the first n-cladding layer 16; and a third n-cladding layer 20 of n-AlGaN formed on the second n-cladding layer 18.

Further, the following layers are sequentially formed on top of one another on the third n-cladding layer 20: an n-side light guiding layer 22 of n-GaN; an n-side SCH (Separate Confinement Heterostructure) layer 24 of InGaN; and an active layer 26.

Still further, the following layers are sequentially formed on top of one another on the active layer 26: a p-side SCH layer 28 of InGaN; an electron barrier layer 30 of p-AlGaN; a p-side light guiding layer 32 of p-GaN; a p-cladding layer 34 of p-AlGaN; and a contact layer 36 of p-GaN.

According to the present embodiment, the buffer layer 14, the first to third n-cladding layers 16, 18, and 20, the n-side light guiding layer 22, and the n-side SCH layer 24 constitute a first semiconductor layer. Further, the p-side SCH layer 28, the electron barrier layer 30, the p-side light guiding layer 32, the p-cladding layer 34, and the contact layer 36 constitute a second semiconductor layer. In other embodiments, however, only the p-cladding layer 34 may constitute the second semiconductor layer.

Channels 38 serving as concave portions are formed in the contact layer 36 and the p-cladding layer 34. As a result, the contact layer 36 and a portion of the p-cladding layer 34 in contact with the contact layer 36 form a waveguide ridge 40.

The waveguide ridge 40 is located in a center portion of the width of the cleaved end faces (or resonator end faces) of the LD 10 and extends between these end faces. The longitudinal dimension of the waveguide ridge 40, that is, the resonator length, is 1000 μm, and the ridge width perpendicular to the longitudinal direction of the ridge is one to a few tens of microns. (The following description of the present embodiment assumes this width to be 1.5 μm.)

Further according to the present embodiment, the width of the channels 38 is 10 μm. The raised platform portions on both sides of the waveguide ridge 40 with the channels 38 therebetween are referred to herein as the "electrode pad platforms 42."

The height of the waveguide ridge 40, that is, its height measured from the bottom surfaces of the channels 38, is, for example, 0.5 μm.

A first silicon oxide film 44 serving as a first insulating film covers both sides of the channels 38 (i.e., the sidewalls of the waveguide ridge 40 and the sidewalls of the electrode pad platforms 42) and the bottom surfaces of the channels 38. The top edges of the first silicon oxide film 44 that covers the sides of the channels 38 are slightly higher than the top surface of the contact layer 36 (i.e., protrude slightly from the top surface of the contact layer 36). The first silicon oxide film 44 is made up of, for example, an $SiO_2$ film having a thickness of 200 nm. The first silicon oxide film 44 does not cover the top surface of the contact layer 36; it has an opening 44a that exposes the entire top surface of the contact layer 36.

A p-side electrode 46 is disposed on and electrically coupled to the top surface of the contact layer 36. The p-side electrode 46 is formed by sequentially depositing platinum (Pt) and Au by evaporation. It closely covers the top surface of the contact layer 36 and extends to cover the surfaces of protruding top edge portions of the first silicon oxide film 44 and also cover the first silicon oxide film 44 on the sidewalls of the waveguide ridge 40 and on portions of the bottom surfaces of the channels 38.

Further, a second silicon oxide film 48 formed, for example, of $SiO_2$ covers the top surfaces of the electrode pad platforms 42 and also covers the first silicon oxide film 44 on the sides of the electrode pad platforms 42 (within channels 38) and on portions of the bottom surfaces of the channels 38.

A pad electrode 50 is disposed on and in close contact with the top surface of the p-side electrode 46. It extends to cover the p-side electrode 46, the first silicon oxide film 44, and the second silicon oxide film 48 within the channels 38 on both sides of the waveguide ridge 40 and also cover the second silicon oxide film 48 on the top surfaces of the electrode pad platforms 42.

Further, an n-side electrode 52 is disposed on the bottom surface of the n-GaN substrate 12. The n-side electrode 52 is formed by sequentially depositing Ti and Au films by evaporation.

This LD 10 is doped with silicon (Si) and magnesium (Mg), which act as n-type and p-type impurities, respectively.

The n-GaN substrate 12 has a thickness of approximately 500-700 μm, and the buffer layer 14 has a thickness of approximately 1 μm. The first n-cladding layer 16 has a thickness of approximately 400 nm and is formed, for example, of n-$Al_{0.07}Ga_{0.93}N$. The second n-cladding layer 18 has a thickness of approximately 1000 nm and is formed, for example, of n-$Al_{0.045}Ga_{0.955}N$. The third n-cladding layer 20 has a thickness of approximately 300 nm and is formed, for example, of n-$Al_{0.015}Ga_{0.95}N$.

The n-side light guiding layer 22 has a thickness of, for example, 80 nm. The n-side SCH layer 24 has a thickness of 30 nm and is formed of i-$In_{0.02}Ga_{0.98}N$.

The active layer 26 has a double quantum well structure made up of a well layer 26a of i-$In_{0.12}Ga_{0.88}N$ having a thickness of 5 nm, a barrier layer 26b of i-$In_{0.02}Ga_{0.98}N$ having a thickness of 8 nm, and a well layer 26c of i-$In_{0.12}Ga_{0.88}N$ having a thickness of 5 nm. The well layer 26a is disposed on and in contact with the n-side SCH layer 24, the barrier layer 26b is disposed on the well layer 26a, and the well layer 26c is disposed on the barrier layer 26b.

The p-side SCH layer 28 disposed on and in contact with the well layer 26c of the active layer 26 has a thickness of 30 nm and is formed of i-$In_{0.02}Ga_{0.98}N$.

The electron barrier layer 30 has a thickness of approximately 20 nm and is formed of p-$Al_{0.2}Ga_{0.8}N$. The p-side light guiding layer 32 has a thickness of 100 nm, and the p-cladding layer 34 has a thickness of approximately 500 nm and is formed of p-$Al_{0.07}Ga_{0.93}N$. The contact layer 36 has a thickness of 20 nm.

Figure 2:
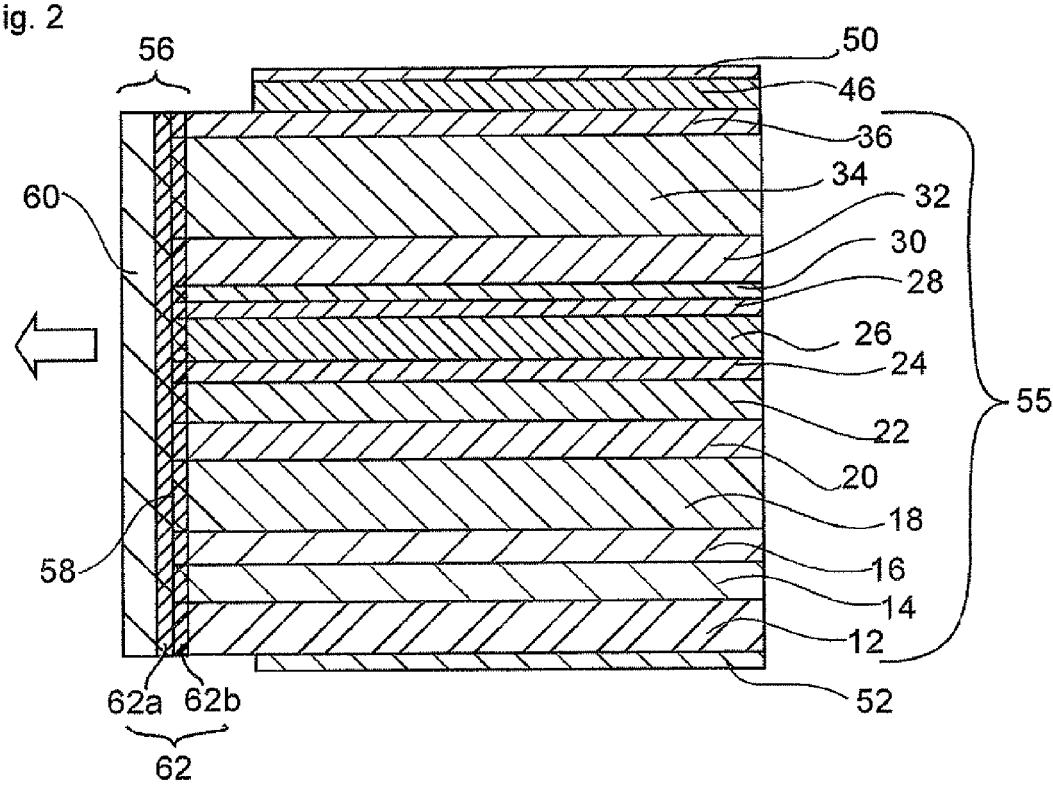
FIG. 2 is a cross-sectional view of the LD taken along line II-II of FIG. 1.

FIG. 2 is a cross-sectional view of the LD taken along line II-II of FIG. 1.

Referring to FIG. 2 the arrow indicates the emitted light. The GaN substrate 12 and the overlying semiconductor layers including the top contact layer 36 together form a laminated semiconductor structure (or semiconductor multilayer structure) 55. In the LD 10 of the present embodiment, a window structure 56 is formed at the emitting cleaved end face 58 of the semiconductor laminated structure 55, and includes an $SiO_2$ film 60 and an interdiffusion layer 62. More specifically, the interdiffusion layer 62 is formed between and extends into the $SiO_2$ film 60 and the cleaved end face portion 58 of the laminated semiconductor structure 55. The portion of the interdiffusion layer 62 extending into the $SiO_2$ film 60 is referred to herein as the "interdiffusion layer 62a," while the portion of the interdiffusion layer 62 extending into the laminated semiconductor structure 55 is referred to herein as the "interdiffusion layer 62b." It should be noted that the interdiffusion layer 62 is formed in the following manner. The $SiO_2$ film 60 is formed on the cleaved end face portion 58 of the laminated semiconductor structure 55 and heat treated so that Ga diffuses from the laminated semiconductor structure 55 into the $SiO_2$ film 60 across the cleaved end face 58 to form the interdiffusion layer 62 made up of the interdiffusion layer 62a and the interdiffusion layer 62b which contains Ga vacancies. The formation of the interdiffusion layer 62b disorders the quantum well structure of the active layer 26, thereby forming a window region therein.

Although in the present embodiment the emitting end face 58 is protected by the remaining portion of the $SiO_2$ film 60, in other embodiments this remaining portion may be removed and another protective coating film may be formed on the interdiffusion layer 62a. Alternatively, an additional protective coating film may be formed on the remaining portion of the $SiO_2$ film 60.

A method for manufacturing the LD 10 will now be described.

Figure 3:
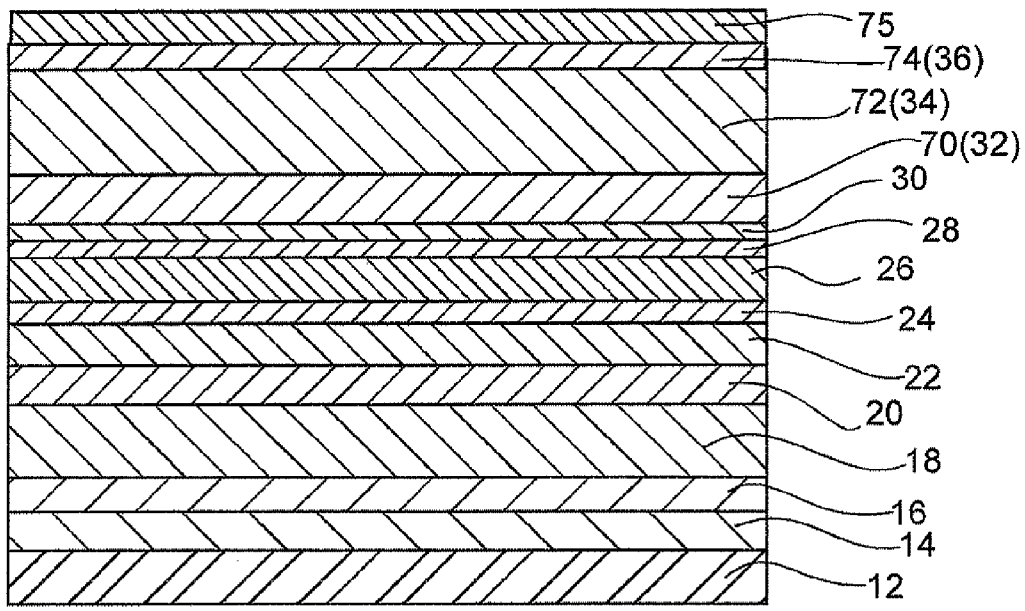
FIGS. 3, 16, and 17 are cross-sectional views
Figure 14:
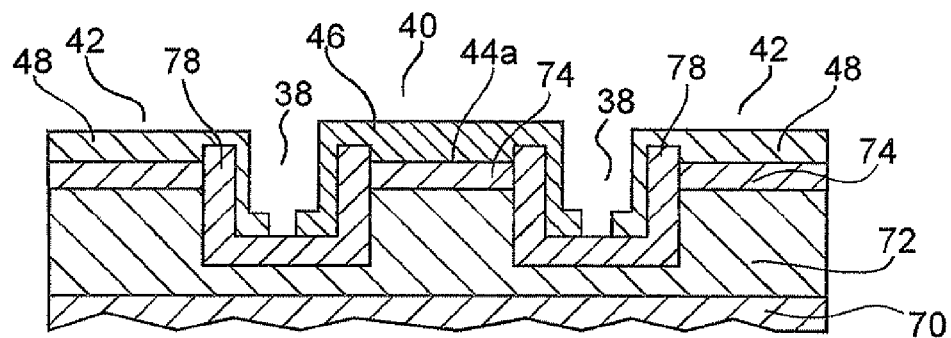
Figure 15:
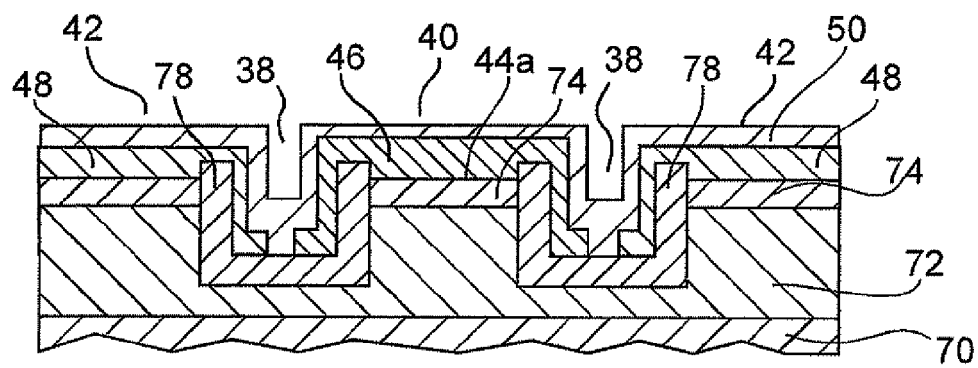
Figure 16:
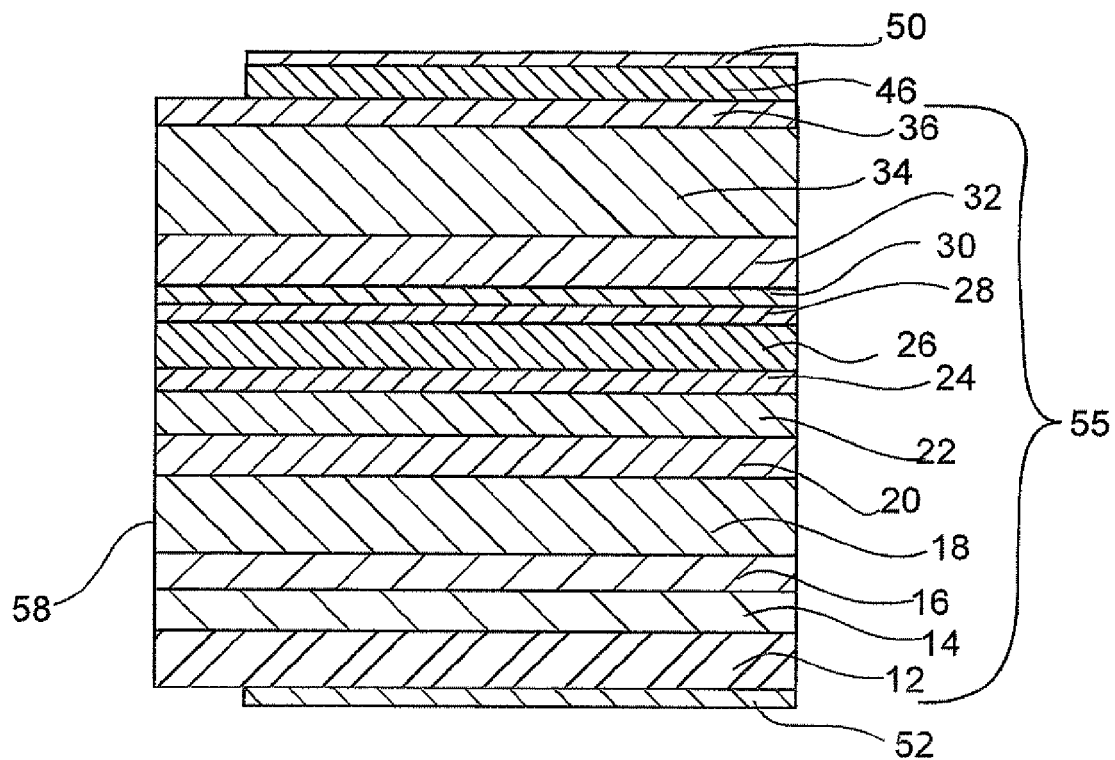
Figure 17:
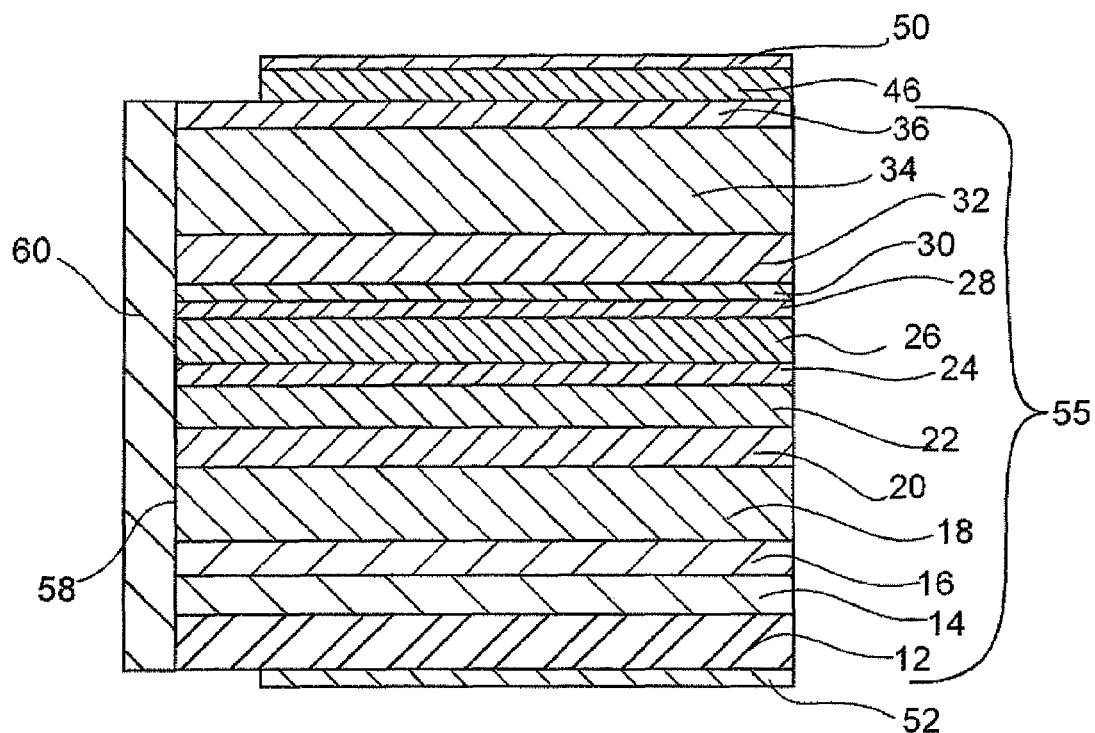

FIGS. 3, 16, and 17 are cross-sectional views and FIGS. 4 to 15 are partial cross-sectional views illustrating process steps in a method for manufacturing an LD according to the present invention. The cross-sectional views shown in FIGS. 3 to 15 are taken in the same manner as the cross-sectional view of FIG. 1. The cross-sectional views shown in FIGS. 16 and 17, on the other hands are taken in the same manner as the cross-sectional view of FIG. 2.

It should be noted that FIGS. 4 to 15 do not show the electron barrier layer 30 and the underlying layers including the n-GaN substrate 12, since these layers do not change in any substantial way in the process steps described below after they are formed. These figures only show a cross section of a portion of the p-side light guiding layer 32 (or 70) and a cross section of each overlying layer.

Referring to FIG. 3, this method begins by providing a GaN substrate 12 whose surfaces have been cleaned by thermal cleaning, etc. An n-GaN layer (which is or will become the buffer layer 14) is then formed on the GaN substrate 12 by metalorganic chemical vapor deposition (MOCVD) at a growth temperature of, e.g., 1000° C.

Next, the following layers are sequentially formed on top of one another: an n-$Al_{0.07}Ga_{0.93}N$ layer (which is or will become the first n-cladding layer 16); an n-$Al_{0.045}Ga_{0.955}N$ layer (the second n-cladding layer 18); an n-$Al_{0.015}Ga_{0.985}N$ layer (the third n-cladding layer 20); an i-$In_{0.02}Ga_{0.98}N$ layer (the n-side light guiding layer 22); and an i-$In_{0.02}Ga_{0.98}N$ layer (the n-side SCH layer 24). Further, an i-$In_{0.12}Ga_{0.88}N$ layer (which is or will become the well layer 26a), not shown, an i-$In_{0.02}Ga_{0.98}N$ layer (the barrier layer 26b), not shown, and an i-$In_{0.12}Ga_{0.88}N$ layer (the well layer 26c), not shown, are sequentially formed on top of one another on the n-side SCH layer 24. (The well layers 26a and 26c and the barrier layer 26b sandwiched therebetween form the active layer 26, as described above.)

Next, the following layers are sequentially formed on top of one another on the active layer 26: an i-$In_{0.02}Ga_{0.98}N$ layer (which is or will become the p-side SCH layer 28); a p-$Al_{0.2}Ga_{0.8}N$ layer (the electron barrier layer 30); a p-$Al_{0.2}Ga_{0.8}N$ layer 70 (the p-side light guiding layer 32); a p-$Al_{0.7}Ga_{0.93}N$ layer 72 (the p-cladding layer 34); and a p-GaN layer 74 (the contact layer 36). Further, a metal capping layer 75 of Au or Cr etc. serving as a capping layer is formed on the p-GaN layer 74.

FIG. 3 shows the results of this process step.

It should be noted that a thin Ti layer, which has good adhesion to the p-GaN layer 74, may be formed on the p-GaN layer 74 and then Au or Cr, etc. may be deposited onto the Ti layer to form the metal capping layer 75.

Figure 4:
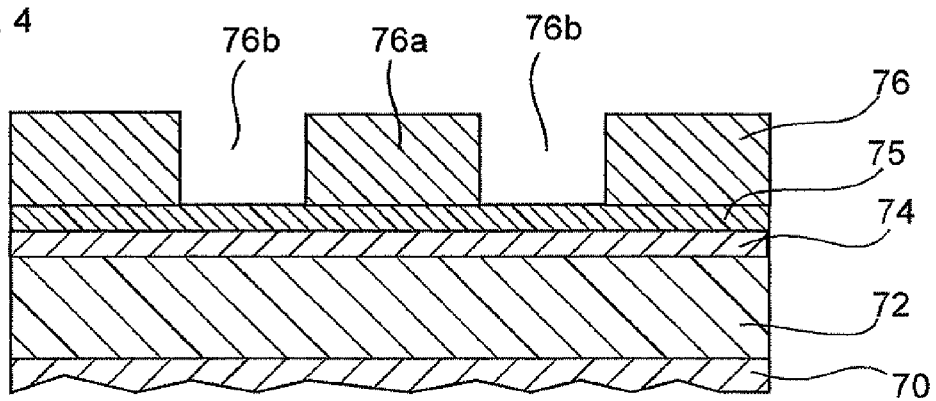
FIGS. 4 to 15 are partial cross-sectional views illustrating process steps in a method for manufacturing an LD according to the present invention.

Referring now to FIG. 4, a resist is applied over the entire surface of the metal capping layer 75 on the laminated semiconductor structure, and this resist is patterned into a resist pattern 76 serving as a first resist pattern by a photolithography process. The resist pattern 76 includes a portion 76a corresponding to the shape of the waveguide ridge 40 (formed later in the process) and cutout portions 76b remaining in correspondence to the shapes of the channels 38 (formed later in the process), as shown in FIG. 4. According to the present embodiment, the portion 76a corresponding to the shape of the waveguide ridge 40 has a width of 1.5 μm, and the cutout portions 76b corresponding to the shapes of the channels 38 have a width of 10 μm.

Figure 5:
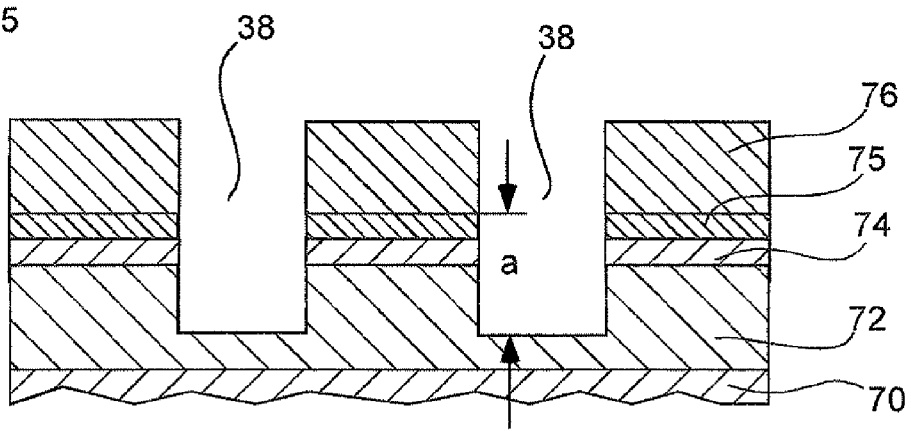

Referring now to FIG. 5, the metal capping layer 75 and the p-GaN layer 74 are etched through their entire thickness and the p-$Al_{0.07}Ga_{0.93}N$ layer 72 is etched to a predetermined depth using the resist pattern 76 as a mask to form the channels 38 whose bottoms are defined by remaining portions of the p-$Al_{0.07}Ga_{0.93}N$ layer 72.

For example, first, the metal capping layer 75 is etched through its entire thickness by dry etching. The p-GaN layer 74 is then etched through its entire thickness and the p-$Al_{0.07}Ga_{0.93}N$ layer 72 is etched to a predetermined depth by RIE (Reactive Ion Etching) to form the channels 38 whose bottoms are defined by remaining portions of the p-$Al_{0.07}Ga_{0.93}N$ layer 72. According to the present embodiment, the entire etch depth a is approximately equal to the thickness of the metal capping layer 75 plus 500 nm (or 0.5 μm). Forming the channels 38 results in the formation of the waveguide ridge 40 and the electrode pad platforms 42, as shown in FIG. 5.

Figure 6:
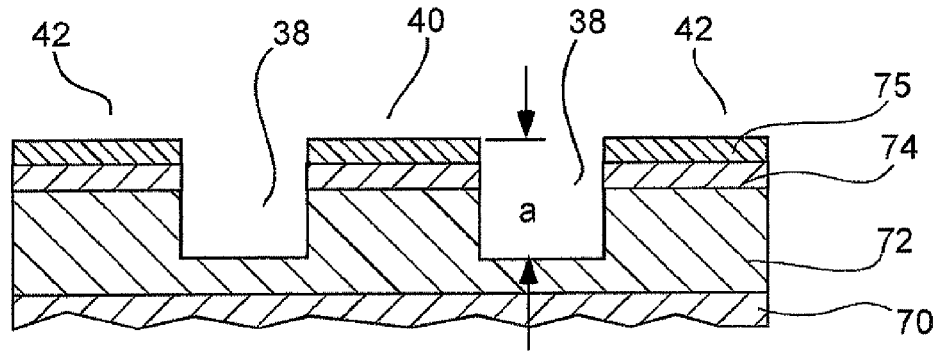

Referring now to FIG. 6, the resist pattern 76, which has been used in the above etching process, is removed by an organic solvent, etc., with the result that the depth of the channels 38, that is, the height of the waveguide ridge 40, is equal to the etch depth a (i.e., the thickness of the metal capping layer 75 plus 500 nm, or 0.5 μm). FIG. 6 shows the results of this process step.

Figure 7:
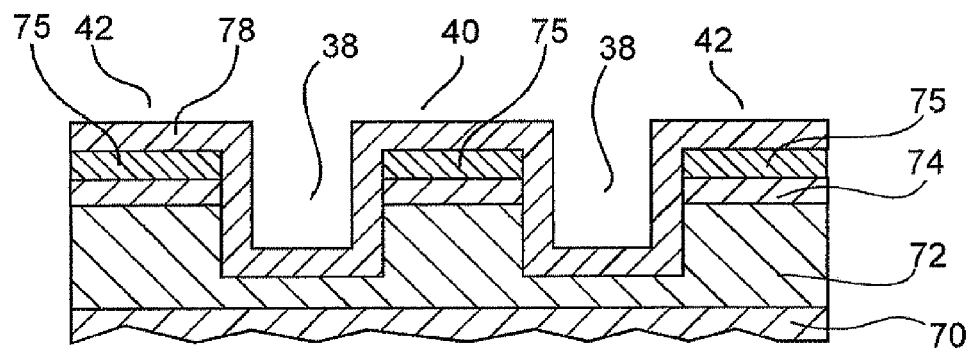

Referring now to FIG. 7, an $SiO_2$ film 78 (which will become the first silicon oxide film 44, serving as a first insulating film) is formed over the entire surface of the wafer by CVD, evaporation, sputtering, etc. to a thickness of, e.g., 0.2 μm. The $SiO_2$ film 78 covers the top surface of the waveguide ridge 40, the inner surfaces of the channels 38, and the top surfaces of the electrode pad platforms 42, as shown in FIG. 7.

It should be noted that instead of the $SiO_2$ film 78, one of the following insulating films may be formed: $SiO_x$ (0<x<2), SiN, SiON, $TiO_2$, $Ta_2O_5$, $Al_2O_3$, AlN, $ZrO_2$, and $Nb_2O_5$ films.

Figure 8:
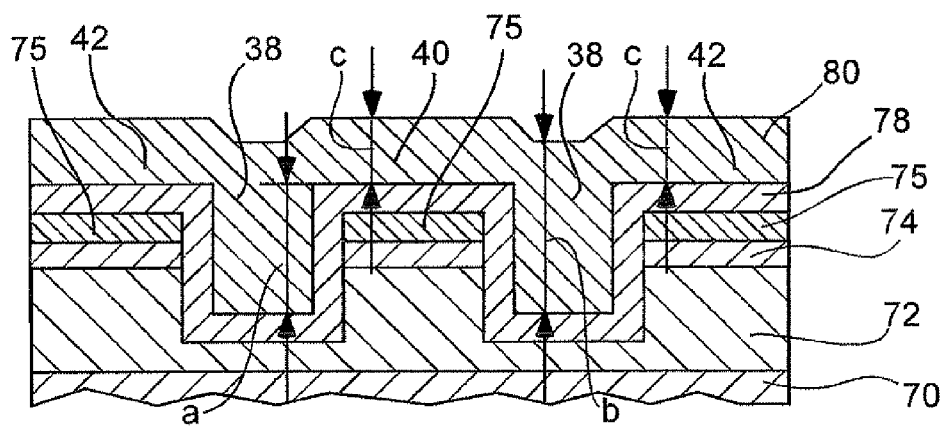

Referring now to FIG. 8, a photoresist is applied over the entire surface of the wafer to form a resist film 80 such that the thickness b of the resist film 80 on the channels 38 is greater than the thickness c of the resist film 80 on the top of the waveguide ridge 40 and on the tops of the electrode pad platforms 42. For example, the resist film 80 may be formed such that b~ 0.8 μm and c~ 0.4 μm.

Although in FIG. 8 the top surface of the resist film 80 is lower on the channels 38 than on the top of the waveguide ridge 40 and on the tops of the electrode pad platforms 42 (that is, the surface of the resist film 80 is concavely curved above the channels 38), it may be uniformly flat and level across the entire top surface of the resist film 80, which automatically ensures that b>c.

However, according to the present embodiment, the top surface of the resist film 80 may have any shape if the inequality b>c is satisfied. That is, the top surface of the resist film 80 may be concavely curved above the channels 38, as shown in FIG. 8. FIG. 8 shows the results of this process step.

Figure 9:
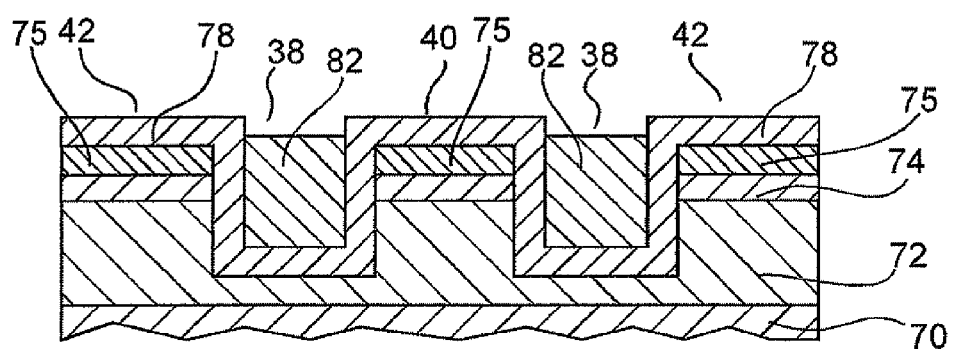

Referring now to FIG. 9, material is uniformly removed from the surface of the resist film 80 so that the resist film 80 is completely removed from on top of the waveguide ridge 40 and the electrode pad platforms 42 but left in the channels 38, thereby forming a resist pattern 82 that exposes the $SiO_2$ film 78 on the top of the waveguide ridge 40 and on the tops of the electrode pad platforms 42.

More specifically, a predetermined thickness of material (in the present embodiment, approximately 400 nm of material) is removed from the surface of the resist film 80, for example, by $O_2$ plasma dry etching so that the $SiO_2$ film 78 on the top of the waveguide ridge 40 and on the tops of the electrode pad platforms 42 are completely exposed but the resist film 80 is left in the channels 38 in such a way that the top surfaces of the remaining portions (82) of the resist film 80 are higher than the top surface of the metal capping layer 75.

Thus, according to the present embodiment, the resist film 80 is etched such that the top surfaces of the remaining portions, i.e., the resist pattern 82, are higher than the top surface of the metal capping layer 75. However, the resist pattern 82 can have any height (or thickness) as long as its top surface is higher than the top surface of the second semiconductor layer, i.e., the top surface of the contact layer 36. (It should be noted that the second semiconductor layer includes the p-side SCH layer 28, the electron barrier layer 30, the p-side light guiding layer 32, the p-cladding layer 34, and the contact layer 36 which are stacked successively on top of one another, as described above.)

It should be noted that in the previous step the resist film 80 is formed to a thickness of approximately 800 nm on the channels 38 and to a thickness of approximately 400 nm on the top of the waveguide ridge 40 and on the tops of the electrode pad platforms 42. Therefore, the above removal of 400 nm of material from the surface of the resist film 80 by etching completely removes the resist film 80 from on top of the waveguide ridge 40 and the electrode pad platforms 42 and thereby exposes the top surfaces of the $SiO_2$ film 78. Further, this also results in the fact that the top surfaces of the resist film 80 in the channels 38 are lower than the top surfaces of the $SiO_2$ film 78 by one-half of the thickness of the $SiO_2$ film 78. The remaining portions of the resist film 80 form the resist pattern 82 serving as a second resist pattern.

FIG. 9 shows the results of this process step.

Figure 10:
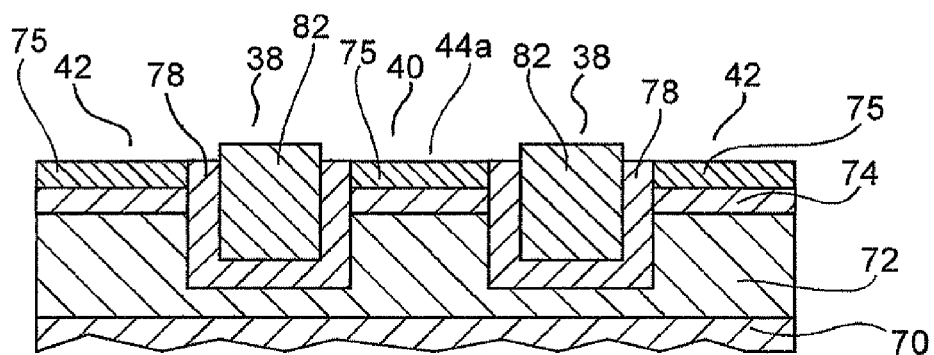

Referring now to FIG. 10, the exposed surfaces of the $SiO_2$ film 78 are uniformly etched using the resist pattern 82 as a mask so that the film is completely removed from on top of the waveguide ridge 40 and the electrode pad platforms 42 but left on the sides and bottoms of the channels 38. As a result, an opening 44a exposing the top of the waveguide ridge 40 is formed in the $SiO_2$ film 78.

This etching may be performed by dry etching such as reactive ion etching in $CF_4$, etc., or wet etching in buffered hydrofluoric acid, etc.

When the $SiO_2$ film 78 is dry etched as described above, the p-GaN layer 74 is protected on top by the covering metal capping layer 75 from etch damage, thereby preventing an increase in the contact resistance between the p-GaN layer 74 (i.e., the contact layer 36) and the overlying p-side electrode formed later in the process, resulting in increased yield of the LD 10. FIG. 10 shows the results of this process step.

Figure 11:
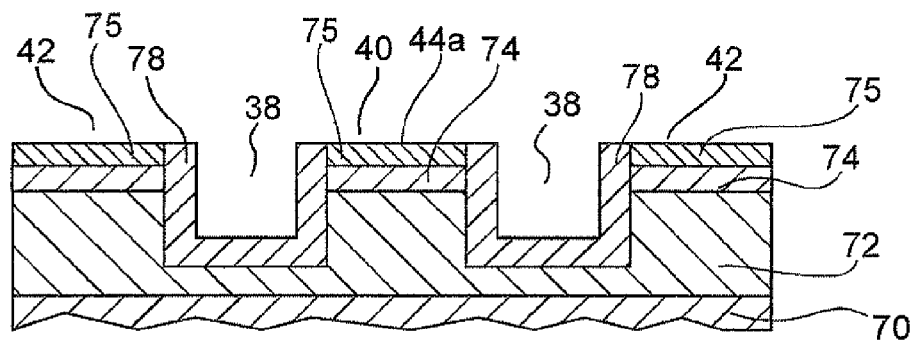

Referring now to FIG. 11, the resist pattern 82 is removed by wet etching in an organic solvent.

Figure 12:
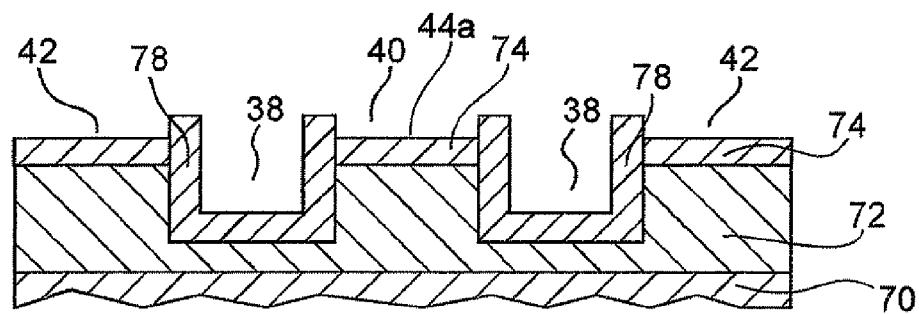

Referring now to FIG. 12, the metal capping layer 75 is removed by wet etching. This wet etching process uses aqua regia when the metal capping layer 75 is made of Au, and uses hydrochloric acid when it is made of Cr.

It should be noted that if this laminated semiconductor structure includes a Ti layer between the contact layer 36 and the overlying metal capping layer 75, the Ti layer may be removed by an HF-based etchant. In such a case, however, the thickness of the Ti layer must be small, since the $SiO_2$ film is also etched by the etchant. FIG. 12 shows the results of this process step.

Figure 13:
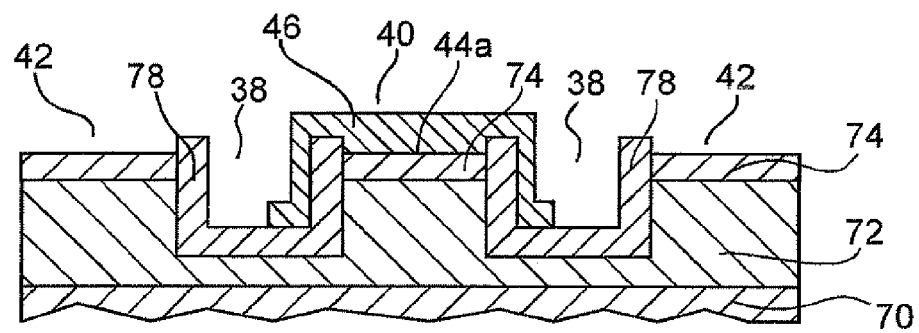

Referring now to FIG. 13, a p-side electrode 46 is formed on the top of the waveguide ridge 40.

More specifically, first, a resist is applied over the entire surface of the wafer and patterned by a photolithography process into a resist pattern (not shown) that exposes the top surface of the p-GaN layer 74 (i.e., the top layer of the waveguide ridge 40), the sidewalls of the waveguide ridge 40, and portions of the bottoms of the channels 38. An electrode layer made up of a laminated structure of Pt and Au is then formed over the resist pattern by, for example, evaporation, and the resist film (or pattern) and the overlying portion of the electrode layer are removed by lift-off to form the p-side electrode 46.

Thus, the top surface of the p-GaN layer 74 at the top of the waveguide ridge 40 is not covered with the $SiO_2$ film 78 and is entirely exposed through the opening 44a (when the electrode layer is formed), preventing a reduction in the contact area and hence an increase in the contact resistance between the p-side electrode 46 and the p-GaN layer 74.

The top edges of the $SiO_2$ film 78 that covers the sides of the channels 38 protrude slightly from the top surfaces of the p-GaN layer 74. The p-side electrode 46 closely covers the top surface of the p-GaN layer 74 at the top of the waveguide ridge 40 and extends to cover the surfaces of protruding top edge portions of the $SiO_2$ film 78 and also cover the $SiO_2$ film 78 on the sidewalls of the waveguide ridge 40 and on portions of the bottom surfaces of the channels 38. FIG. 13 shows the results of this process step.

Next, a second silicon oxide film 48 is formed.

Specifically, referring to FIG. 14, first a resist is applied over the entire surface of the wafer and patterned by a photolithography process into a resist pattern (not shown) that exposes the surface of the wafer except for the surface of the p-side electrode 46 (that is, exposes the top surfaces of the electrode pad platforms 42, the sides of the electrode pad platforms 42 within the channels 38, and portions of the bottoms of the channels 38). An $SiO_2$ film is then formed over the entire surface of the wafer by evaporation to a thickness of 100 nm, and the resist film (pattern) on the p-side electrode 46 and the portion of the $SiO_2$ film on the resist film are removed by lift-off to form a second silicon oxide film 48 (made up of the remaining portions of the $SiO_2$ film). FIG. 14 shows the results of this process step.

It should be noted that instead of the $SiO_2$ film, one of the following insulating films may be formed: $SiO_x$ ($0<x<2$), SiN, SiON, $TiO_2$, $Ta_2O_5$, $Al_2O_3$, AlN, $ZrO_2$, and $Nb_2O_5$ films.

Referring now to FIG. 15, a metal film of Ti, Pt, and Au is formed over the p-side electrode 46, the channels 38, and the second silicon oxide film 48 by evaporation to form a pad electrode 50. This completes the formation of the semiconductor optical device structure.

Referring now to FIG. 16, the wafer is cleaved along crystal planes perpendicular to the waveguide direction to produce LD bars. Each LD bar includes a plurality of (identical) LD structures arranged in a line and each having a waveguide of a predetermined length. FIG. 16 is a cross-sectional view of one of the LD structures taken in the longitudinal direction of the waveguide. In FIG. 16, reference numeral 58 denotes a cleaved end face (namely, the light emitting end face) of the LD device or the LD bar.

Referring now to FIG. 17, an $SiO_2$ film 60 serving as a dielectric film having a thickness of, e.g., 0.2 μm is formed on the cleaved end face 58 by CVD, ECR, evaporation, sputtering, MBE, etc. FIG. 17 shows the results of this process step.

It should be noted that instead of the $SiO_2$ film, one of the following insulating films may be formed: $SiON_x$, $TiO_2$, $Al_2O_3$, $Nb_2O_5$, $Ta_2O_5$, $ZrO_2$, and $SiO_x$ films, where $0<x<2$.

Next, the LD bar having the $SiO_2$ film 60 formed on its cleaved end face 58 (as described above) is heat treated at 750° C. in an $N_2$ atmosphere or an atmosphere of $N_2$ and $O_2$ for 2 minutes by RTA to form an interdiffusion layer 62 at the cleaved end face 58 such that the interdiffusion layer 62 extends into the $SiO_2$ film 60 and the laminated semiconductor structure 55. The portion of the interdiffusion layer 62 extending into the $SiO_2$ film 60 is referred to herein as the "interdiffusion layer 62a," while the portion of the interdiffusion layer 62 extending into the laminated semiconductor structure 55 is referred to herein as the "interdiffusion layer 62b." Specifically, Ga diffuses from the laminated semiconductor structure 55 into the $SiO_2$ film 60 across the cleaved end face 58 during the RTA, generating and diffusing Ga vacancies in the cleaved end face portion of the laminated semiconductor structure 55. This forms the interdiffusion layer 62a (made of SiO$_2$ containing Ga) in SiO$_2$ film 60, and the interdiffusion layer 62b (containing Ga vacancies) in the laminated semiconductor structure 55. The formation of the interdiffusion layer 62b disorders the active layer 26, thereby forming a window region therein.

Next, the LD bar is divided into individual LD chips, thereby producing the LD 10 as shown in FIGS. 1 and 2.

Figure 18:
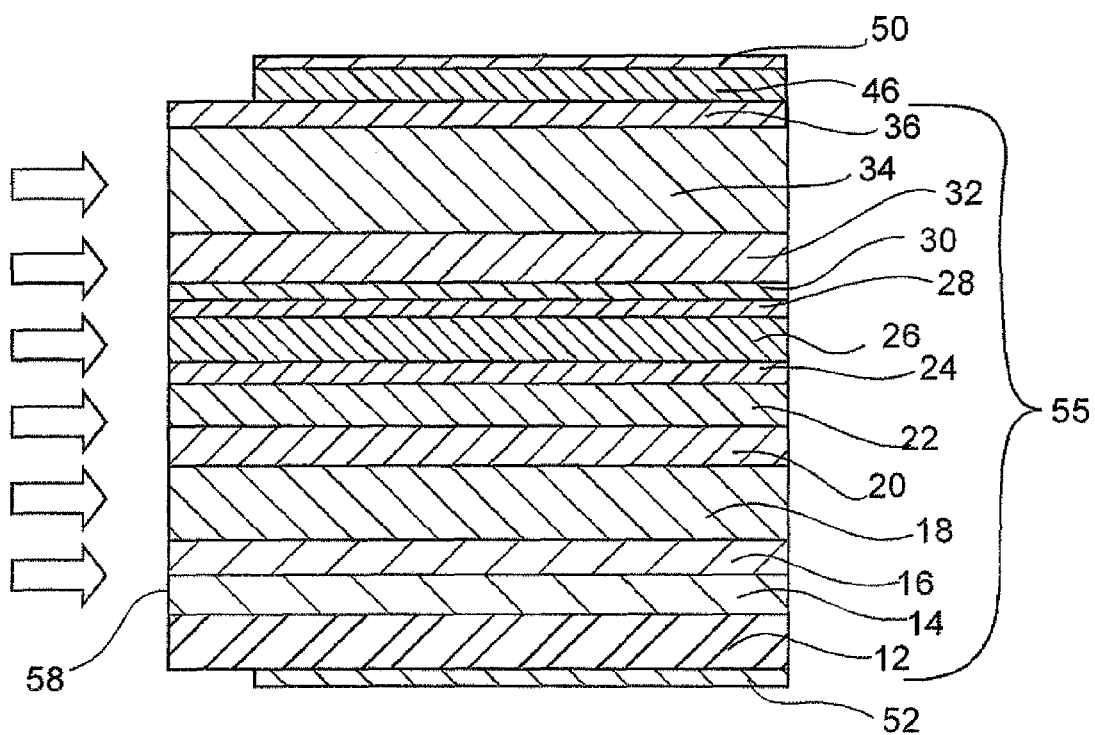
FIG. 18 is a cross-sectional view illustrating a process step in a method for manufacturing an LD according to the present invention.

FIG. 18 is a cross-sectional view illustrating a process step in a method for manufacturing an LD according to the present invention.

As shown in FIG. 18, the cleaved end face 58 may be subjected to ion or plasma irradiation before forming the SiO$_2$ film 60 thereon. Such irradiation damages the cleaved end face 58, thereby allowing reduction of the temperature of the subsequent RTA process. In FIG. 18, the arrows indicate ion or plasma irradiation.

In this manufacturing method of the LD 10, Ga vacancies are directly generated in and diffused from the cleaved end face 58 of the LD, which allows a reduction in the thickness of the window region, i.e., the interdiffusion layer 62b. This results in a reduction in the heat generated by the window region during the operation of the LD, thus making the LD less likely to suffer from COD.

Thus, the GaN-based (blue-violet) LD of the present invention has a window region formed by directly generating and diffusing Ga vacancies in a cleaved end face portion of the LD. The advantages of this LD will be described by comparing it with red LDs.

There are two methods of forming a window region in an LD:

(1) Impurities (Zn or Si) or vacancies (ion implantation, IFVD, etc.) are diffused from surfaces (primarily the p-side surface) of the LD chip into the active layer to disorder the layer.

(2) Impurities or vacancies are directly diffused from a cleaved end face of the LD chip to disorder the active layer.

The first disordering method is advantageous in that it provides high productivity, since window regions are formed before the wafer is cleaved into bars. Furthermore, the active layer can be disordered such that the window regions have a sufficient increase in the bandgap. However, in order to diffuse impurities or vacancies into the active layer, it is necessary to considerably increase the density of these impurities or vacancies in the LD. The increase in impurity or vacancy density increases the free-carrier absorption in the LD, resulting in greater heat generation. Furthermore, the size of the window regions, which act as heat sources, cannot be reduced due to the resolution limit of the pattern transfer process.

The second disordering method is inferior to the first disordering method in that the window region formed in the active layer have a relatively small increase in the bandgap. Furthermore, this method cannot provide high productivity. However, the second method is advantageous in that impurities or vacancies are directly diffused from an end face of the LD into the active layer, allowing the density of these impurities or vacancies in the LD to be reduced, as compared to the first method. The second disordering method can be easily implemented by forming a dielectric film on a cleaved end face of the LD and heat treating it so as to diffuse impurities or vacancies from the cleaved end face into the active layer.

It should be noted that the impurities or vacancies in the window region cause it to absorb light. Therefore, the region heats up due to the heat resulting from this light absorption, as well as the heat generated in the LD during its operation. Since the increase in temperature (or heat energy) of the window region reduces its bandgap, it is necessary to increase the density of the impurities or vacancies in the window region so as to accommodate this heat-induced reduction in the bandgap.

In the case of LDs formed of GaAs-based, InP-based, or AlGaInP-based material, the heat generated due to the light absorption in the window region greatly increases the temperature of the region, since GaAs, InP, and AlGaInP have relatively low heat conductivities of 0.55 W/cm*K, 0.68 W/cm*K, and 0.067 W/cm*K, respectively. This means that the window region formed in the active layer of such LDs by the above second method cannot provide sufficient resistance to COD, since it has a relatively small increase in the bandgap.

In the case of LDs formed of GaN-based material, such as the LD 10 described above, on the other hand, the heat generated due to the light absorption in the window region does not greatly increase the temperature of the region, since GaN has a heat conductivity of 2 W/cm*K (higher than the heat conductivities of the materials for red LDs). That is, the window region can provide sufficient resistance to COD even if it has a relatively small increase in the bandgap.

This means that the window region can provide sufficient resistance to COD even if the region contains only a low density of impurities or vacancies. That is, in the case of an LD of GaN-based material, the window region formed in the active layer by the second method can provide sufficient resistance to COD.

Thus, the method of the present embodiment for manufacturing the LD 10 forms a window region in the following manner. An SiO$_2$ film 60 is formed on a cleaved end face 58 of a laminated semiconductor structure 55 and heat treated by RTA such that Ga diffuses from the laminated semiconductor structure 55 into the SiO$_2$ film 60 across the cleaved end face 58, generating and diffusing Ga vacancies in the laminated semiconductor structure 55 and thereby forming an interdiffusion layer 62b therein. The portion of the interdiffusion layer 62b in the active layer 26 forms a disordered window region of the LD.

According to this manufacturing method of the LD 10, Ga vacancies are directly diffused from the cleaved end face 58 into the laminated semiconductor structure 55, that is, the Ga vacancies need not go through any layer to reach the active layer 26. This means that it is not necessary to generate or diffuse extra Ga vacancies in the LD, allowing the density of Ga vacancies in the LD to be reduced. Further, since the resolution limit of the pattern transfer process does not affect the accuracy of the formation of the window region, the size of the window region can be reduced to reduce the heat generated therein. As a result, it is possible to manufacture a GaN-based LD having high resistance to COD by employing a simple process.

As described above. A method for manufacturing a semiconductor optical device according to the present invention comprising: forming a laminated semiconductor structure of GaN-based material on a semiconductor wafer, the laminated semiconductor structure having a first semiconductor layer of a first conductivity type, an active layer including a quantum well structure, and a second semiconductor layer of a second conductivity type, in sequence, on a semiconductor substrate; cleaving the semiconductor wafer to expose a cleaved end face of the laminated semiconductor structure; forming a dielectric film on the cleaved end face; and disordering the quantum well structure of the active layer by performing a heat treatment to cause Ga vacancy diffusion in the active layer.

Accordingly, The heat treatment described above causes Ga to be diffused from the laminated semiconductor structure into the dielectric film, generating and diffusing Ga vacancies in the laminated semiconductor structure. This disorders the quantum well structure of the active layer and thereby forms a window structure therein. Since no impurities are used in this window forming process, the formed window structure has low light absorption. As a result, it is possible to manufacture a semiconductor optical device of GaN-based material in such a way that a window structure is formed in an end face of the device by a simple process to prevent COD thereto.

Thus, the method for manufacturing a semiconductor optical device according to the present invention is suitable for manufacturing a semiconductor optical device formed of GaN-based material.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor optical device, comprising:
    forming a laminated semiconductor structure of GaN-based materials on a semiconductor wafer, the laminated semiconductor structure having a first semiconductor layer of a first conductivity type, an active layer including a quantum well structure, and a second semiconductor layer of a second conductivity type, in sequence, on a semiconductor substrate;
    cleaving the semiconductor wafer and laminated semiconductor structure to expose a cleaved end face of the laminated semiconductor structure;
    after cleaving the wafer, irradiating the cleaved end face with ions or plasma;
    after irradiating the cleaved end face with ions or plasma, forming a dielectric film on the cleaved end face; and
    heat treating and disordering the quantum well structure of the active layer by producing Ga vacancy diffusion in the active layer.

2. The method for manufacturing a semiconductor optical device according to claim 1, further comprising:
    forming, in a photolithography process, a first resist pattern of a first resist film disposed on a top surface of the laminated semiconductor structure, the first resist pattern having a stripe-shaped portion having a width corresponding to a waveguide ridge;
    removing upper portions of the second semiconductor layer by dry etching, using the first resist pattern as a mask, to form concave portions, leaving lower portions of the second semiconductor layer, thereby forming the waveguide ridge;
    forming a first insulating film on a top surface of the laminated semiconductor structure, including on the concave portions, after removing the first resist pattern;
    forming a second resist pattern covering the first insulating film in the concave portions, adjacent the waveguide ridge, and exposing a top surface of the first insulating film on top of the waveguide ridge, the second resist pattern having a top surface on the concave portions that is farther from the substrate than a top surface of the second semiconductor layer in the waveguide ridge and that is closer to the substrate than a top surface of the first insulating film on the top of the waveguide ridge;
    removing the first insulating film by etching, using the second resist pattern as a mask, to expose a top surface of the second semiconductor layer on the waveguide ridge; and
    forming an electrode layer on the top surface of the second semiconductor layer on the waveguide ridge, after removing the second resist pattern.

3. The method for manufacturing a semiconductor optical device according to claim 1, wherein
    the dielectric film is made of a material including an oxide selected from the group consisting of silicon oxide, niobium oxide, aluminum oxide, and titanium oxide; and
    the dielectric film is formed by a technique selected from the group consisting of evaporation, sputtering, chemical vapor depositor, and molecular beam epitaxy.

4. The method for manufacturing a semiconductor optical device according to claim 1, including heat treating by rapid thermal annealing.

* * * * *